(12) United States Patent
Duong et al.

(10) Patent No.: US 12,057,252 B2
(45) Date of Patent: Aug. 6, 2024

(54) ELECTRONIC SUBSTRATES HAVING EMBEDDED INDUCTORS

(71) Applicant: Intel Corporation, Santa Clara, CA (US)

(72) Inventors: Benjamin Duong, Phoenix, AZ (US); Michael Garelick, Chandler, AZ (US); Darko Grujicic, Chandler, AZ (US); Tarek Ibrahim, Mesa, AZ (US); Brandon C. Marin, Chandler, AZ (US); Sai Vadlamani, Chandler, AZ (US); Marcel Wall, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 713 days.

(21) Appl. No.: 17/029,870

(22) Filed: Sep. 23, 2020

(65) Prior Publication Data

US 2022/0093316 A1 Mar. 24, 2022

(51) Int. Cl.
| | |
|---|---|
| *H05K 1/02* | (2006.01) |
| *H01F 1/37* | (2006.01) |
| *H01F 17/04* | (2006.01) |
| *H01F 17/06* | (2006.01) |
| *H01F 27/24* | (2006.01) |
| *H01F 27/245* | (2006.01) |

(Continued)

(52) U.S. Cl.
CPC ......... *H01F 27/2804* (2013.01); *H01F 41/32* (2013.01); *H01L 23/49827* (2013.01);

(Continued)

(58) Field of Classification Search
CPC ............ H05K 1/02; H05K 1/028; H05K 1/09; H05K 1/092; H05K 1/115; H05K 1/165;

(Continued)

(56) References Cited

U.S. PATENT DOCUMENTS

| | | | |
|---|---|---|---|
| 6,362,012 B1 * | 3/2002 | Chi ..................... | H01L 27/08 257/532 |
| 6,469,609 B2 | 10/2002 | Lee et al. | |

(Continued)

FOREIGN PATENT DOCUMENTS

| | | |
|---|---|---|
| WO | 2018094162 | 5/2018 |
| WO | 2019181463 | 9/2019 |

OTHER PUBLICATIONS

International Preliminary Report on Patentability for PCT Patent Application No. PCT/US2021/044884, dated Apr. 6, 2023.

(Continued)

*Primary Examiner* — Xiaoliang Chen
(74) *Attorney, Agent, or Firm* — Essential Patents Group, LLP (57) ABSTRACT

An electronic substrate may be fabricated by forming a base substrate and forming an inductor extending through the base substrate, wherein the inductor includes a magnetic material layer and a barrier layer, such that the barrier layer prevents the magnetic material layer from leaching into plating solutions during the fabrication of the electronic substrate. In one embodiment, the barrier material may comprise titanium. In another embodiment, the barrier layer may comprise a polymeric material. In still another embodiment, the barrier layer may comprise a nitride material layer. The inductor may further include a plating seed layer on the barrier layer and a conductive fill material abutting the plating seed layer.

11 Claims, 6 Drawing Sheets

(51) Int. Cl.
*H01F 27/28* (2006.01)
*H01F 27/29* (2006.01)
*H01F 41/24* (2006.01)
*H01F 41/32* (2006.01)
*H01L 23/15* (2006.01)
*H01L 23/498* (2006.01)
*H01L 23/64* (2006.01)
*H05K 1/09* (2006.01)
*H05K 3/02* (2006.01)
*H05K 3/42* (2006.01)

(52) U.S. Cl.
CPC .... *H01L 23/645* (2013.01); *H01F 2027/2809* (2013.01); *H01L 23/49816* (2013.01)

(58) Field of Classification Search
CPC ...... H05K 1/181; H05K 1/183; H05K 3/0002; H05K 3/0047; H05K 3/0094; H05K 3/42; H05K 3/422; H05K 3/426; H01F 1/37; H01F 17/0013; H01F 17/04; H01F 17/06; H01F 27/24; H01F 27/29; H01F 27/245; H01F 27/2804; H01F 41/041; H01F 41/042; H01F 41/046; H01F 41/24; H01F 41/32; H01F 2027/2809; H01L 21/486; H01L 21/76877; H01L 23/15; H01L 23/147; H01L 23/481; H01L 23/645; H01L 23/4046; H01L 23/4692; H01L 23/5223; H01L 23/5227; H01L 23/48816; H01L 23/49822; H01L 23/49827
USPC ........ 361/782; 174/255, 257, 258, 260, 266; 438/3, 253, 396; 29/608, 846; 336/192, 336/200
See application file for complete search history.

(56) References Cited

U.S. PATENT DOCUMENTS

| | | | |
|---|---|---|---|
| 7,812,702 B2 * | 10/2010 | Mano | H01F 17/0006 336/200 |
| 10,121,739 B1 | 11/2018 | Kirby | |
| 11,676,853 B2 | 6/2023 | Yu et al. | |
| 2005/0150683 A1 * | 7/2005 | Farnworth | H05K 3/426 257/E23.008 |
| 2009/0294161 A1 | 12/2009 | Yoshimura et al. | |
| 2010/0117779 A1 | 5/2010 | Mano et al. | |
| 2011/0093534 A1 | 4/2011 | Souza | |
| 2013/0113591 A1 * | 5/2013 | Yan | H01F 27/29 336/192 |
| 2014/0077361 A1 | 3/2014 | Lin et al. | |
| 2015/0213946 A1 * | 7/2015 | Mano | H01F 17/04 336/200 |
| 2016/0126010 A1 * | 5/2016 | Wang | H05K 1/028 29/609 |
| 2017/0092416 A1 * | 3/2017 | Rylko | H01F 27/22 |
| 2018/0334588 A1 | 11/2018 | Kayaba et al. | |
| 2019/0274217 A1 * | 9/2019 | Zhang | H05K 3/0026 |
| 2019/0279806 A1 | 9/2019 | Darmawikarta | H01F 27/2804 |
| 2019/0287815 A1 * | 9/2019 | Xu | H01F 41/24 |
| 2019/0385777 A1 | 12/2019 | Kodama et al. | |
| 2020/0413542 A1 * | 12/2020 | Ooyama | H05K 1/09 |
| 2021/0005550 A1 * | 1/2021 | Chavali | H05K 1/181 |
| 2021/0035905 A1 | 2/2021 | Shih | |
| 2021/0125944 A1 | 4/2021 | Lambert et al. | |
| 2021/0159010 A1 * | 5/2021 | Kawai | H01L 23/49822 |
| 2021/0183562 A1 | 6/2021 | Kawai | |
| 2021/0202360 A1 | 7/2021 | Hsu et al. | |
| 2021/0287842 A1 | 9/2021 | Hiraki et al. | |
| 2021/0288027 A1 | 9/2021 | Leschkies et al. | |
| 2022/0093316 A1 | 3/2022 | Duong et al. | |
| 2022/0093535 A1 | 3/2022 | Duong et al. | |

OTHER PUBLICATIONS

Office Action and Search Report for Netherland Patent Application No. 2028990, dated Apr. 5, 2022.
Office Action and Search Report for Netherlands Patent Application No. NL2028989, dated Apr. 4, 2022.
International Search Report and Written Opinion for PCT Application No. PCT/US2021/044884, dated Nov. 26, 2021.
International Search Report and Written Opinion for PCT Application No. PCT/US2021/045041, dated Nov. 30, 2021.

* cited by examiner

ELECTRONIC SUBSTRATES HAVING EMBEDDED INDUCTORS

TECHNICAL FIELD

Embodiments of the present description generally relate to the field of electronic substrates and, more particularly, to the integration of magnetic materials into the electronic substrates to form inductors.

BACKGROUND

The integrated circuit industry is continually striving to produce ever faster and smaller integrated circuit devices for use in various server and mobile electronic products, including but not limited to, computer server products and portable products, such as wearable integrated circuit systems, portable computers, electronic tablets, cellular phones, digital cameras, and the like. However, achieving these goals increases power delivery demands for the integrated circuit devices.

These power delivery demands are supported by inductors, which are used to stabilize electrical current in the integrated circuit devices. As will be understood to those skilled in the art, inductors are passive electrical components that store energy in a magnetic field generated by a magnetic material and are generally stand-alone components that are electrically attached to the integrated circuit devices. In order to produced faster and smaller integrated circuit devices, these inductors may be embedded in electronic substrates, wherein the electronic substrates are used to route electrical signals for active and passive components in the integrated circuit devices. As the speed of the integrated circuit devices increases, the performance of these embedded inductors needs to increase. Thus, there is a need to use solid state magnetic materials comprising iron, nickel, cobalt, and rare-earth metals. However, these magnetic materials may be incompatible with traditional plating chemistries/solutions, such as semi-additive plating chemistries/solutions, as they can leach into these plating chemistries. The leaching of the magnetic material, even at a low number of parts per million, into the plating chemistries may have a detrimental impact on the quality, process stability, and useful life of the plating chemistries.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the formation of an electronic substrate comprising a base substrate and an inductor extending through the base substrate, wherein the inductor includes a magnetic material layer and a barrier layer, wherein the barrier layer prevents the magnetic material layer from leaching into plating solutions during the fabrication of the inductor. In one embodiment, the barrier material may comprise titanium. In another embodiment, the barrier layer may comprise a polymeric material. In still another embodiment, the barrier layer may comprise a nitride material layer. The inductor may further include a plating seed layer on the barrier layer and a conductive fill material abutting the plating seed layer.

Figure 1:
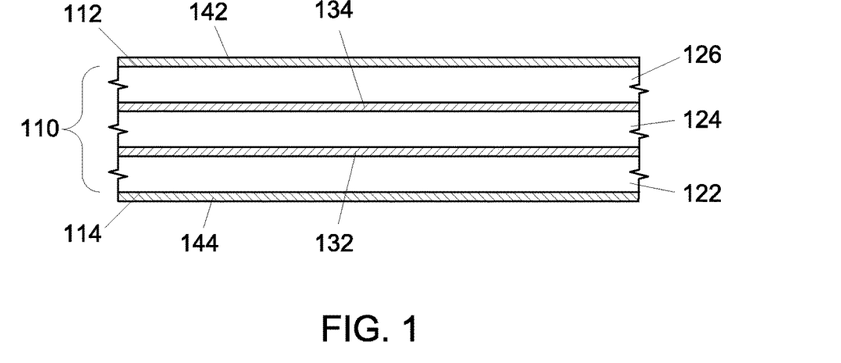
FIGS. 1-13 are side cross-sectional views of a process for the fabrication of an inductor in an electronic substrate, according to various embodiments of the present description.

FIGS. 1-13 illustrate processes for fabricating an inductor in an electronic substrate, according to various embodiments of the present description. FIG. 1 illustrates a base substrate 110 having a first surface 112 and an opposing second surface 114. The base substrate 110 may be any appropriate structure or carrier. The base substrate 110 may comprise a plurality of dielectric material layers (illustrated as a first dielectric material layer 122, a second dielectric material layer 124, and a third dielectric material layer 126), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, low temperature co-fired ceramic materials, and the like, as well as low-k and ultra low-k dielectrics (dielectric constants less than about 3.6), including, but not limited to, carbon doped dielectrics, fluorine doped dielectrics, porous dielectrics, organic polymeric dielectrics, fluoropolymers, and the like.

The base substrate 110 may further include conductive routes or "metallization" extending through the base substrate 110. These conductive routes are illustrated generically as metallization layers 132 and 134, which may be a combination of conductive traces (not shown) formed between the dielectric material layers 122, 124, 126 and conductive vias (not shown) extending through the dielectric material layers 122, 124, 126. The fabrication of conductive traces and conductive vias are well known in the art and are not shown or described for purposes of clarity and conciseness. The conductive traces and the conductive vias may be made of any appropriate conductive material, including but not limited to, metals, such as copper, silver, nickel, gold, and aluminum, alloys thereof, and the like. As will be understood to those skilled in the art, the base substrate 110 may be a cored substrate or a coreless substrate.

As further shown in FIG. 1, a first protective film 142 may be formed on the first surface 112 of the base substrate 110, and a second protective film 144 may be formed on the second surface 114 of the base substrate 110, such as by lamination. The first protective film 142 and the second protective film 144 may be made of any appropriate conductive material, including but not limited to, metals, such as copper, silver, nickel, gold, and aluminum, alloys thereof, and the like.

Figure 2:
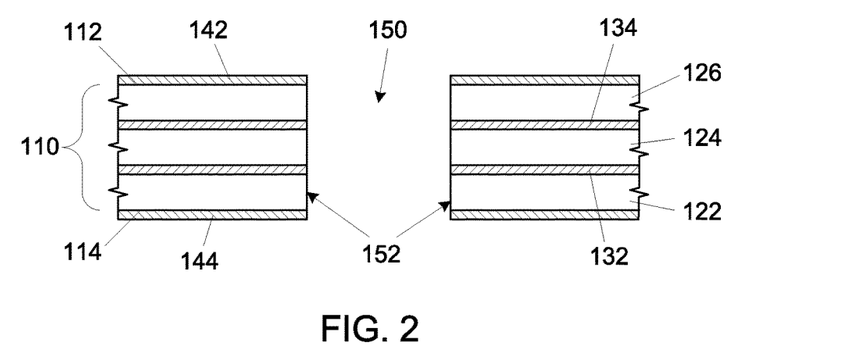

As shown in FIG. 2, at least one opening 150 may be formed and may be defined by at least one sidewall 152 extending through the first protective film 142, through the base substrate 110, and through the second protective film 144. The opening 150 may be formed by any appropriate method known in the art, including, but not limited to, laser drilling, ion ablation, etching, and the like.

Figure 3:
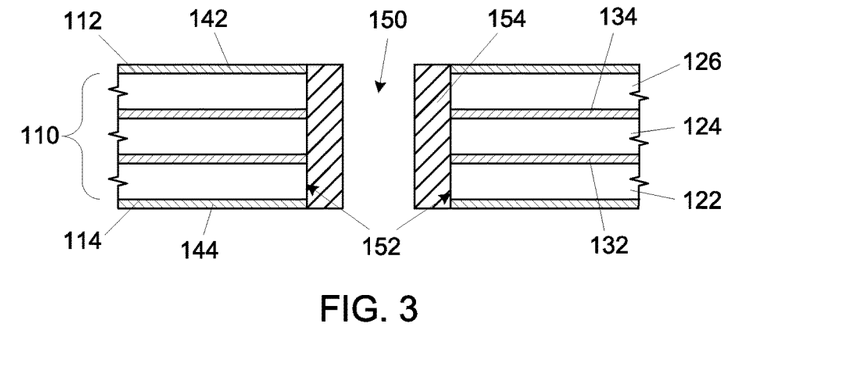

As shown in FIG. 3, a magnetic material layer 154 may be formed adjacent the at least one sidewall 152 of the at least one opening 150. In an embodiment of the present description, the magnetic material layer 154 may comprise any appropriate magnetic material, including, but not limited to, iron, nickel, cobalt, rare-earth metal, alloys thereof, composites thereof, and the like. In one embodiment of the present description, the magnetic material layer 154 may be formed by depositing a conformal magnetic material layer over the base substrate 110 and in the opening 150, then removing any portions of the conformal magnetic material layer not within the opening 150, such as by grinding, polishing, or the like.

Figure 4:
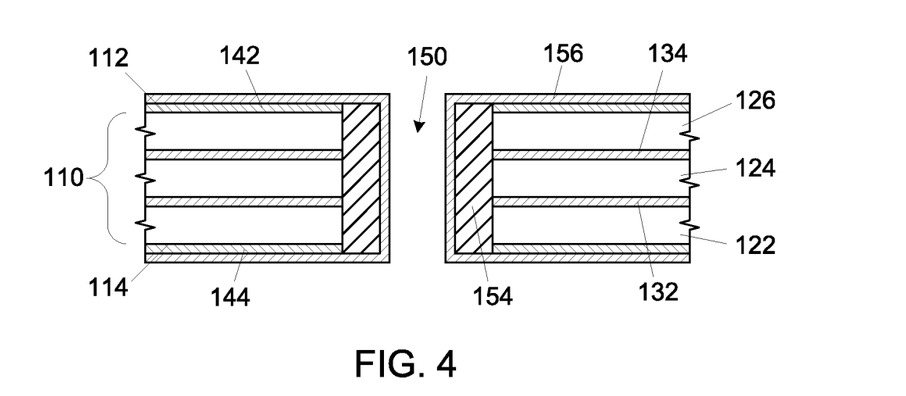

As shown in FIG. 4, a barrier layer 156 may be conformally formed on the magnetic material layer 154 within the opening 150. The barrier layer 156 may extend over the first protective film 142 and the second protective film 144. The barrier layer 156 may act as a barrier to prevent the magnetic material of the magnetic material layer 154 from leaching into the deposition chemistries/plating solutions, such as standard electroless copper deposition chemistries, that may be used in subsequent processing steps. As will be understood by those skilled in the art, leaching of the magnetic material, even at a low number of parts per million, into the deposition chemistries may be detrimental to the quality, process stability, and useful life of the deposition chemistries.

In one embodiment of the present description, the barrier layer 156 may comprise titanium. In a further embodiment of the present description, when a titanium-containing material is used, the barrier layer 156 may be deposited on the magnetic material layer 154 by any appropriate process, including, but not limited to, sputtering, physical vapor deposition, and the like.

In another embodiment of the present description, the barrier layer 156 may comprise a polymeric material. In an embodiment of the present description, the polymeric material may have at least one functional group, such as nitrogen, exposed at its surface allowing for favorable electroless copper catalyst activation and deposition of a seed material layer. The functional groups may include, but are not limited to, nitrogen. In one embodiment of the present description, the barrier layer 156 may be (3-aminopropyl)-trimethoxysilane. In a further embodiment of the present description, when a polymer material is used, the barrier layer 156 may be deposited on the magnetic material layer 154 by any appropriate process, including, but not limited to, immersion, spray coating, and the like. In one embodiment of the present description, the barrier layer 156 may be about 10 nanometers and 50 nanometers thick.

In still another embodiment of the present description, the barrier layer 156 may comprise a nitride material layer. In a specific embodiment of the present description, the nitride material may comprise silicon and nitrogen. The barrier layer 156 may be deposited on the magnetic material layer 154 by any appropriate process, including, but not limited to, low temperature chemical vapor deposition, physical vapor deposition, and the like. The nitride material layer, such as silicon nitride, can provide chemical stability over aggressive chemical conditions, while preserving the integrity of the magnetic material layer 154 and materials subsequently deposited on the barrier layer 156, and may provide favorable adhesion to materials, such as copper, subsequently deposited on the barrier layer 156.

Figure 5:
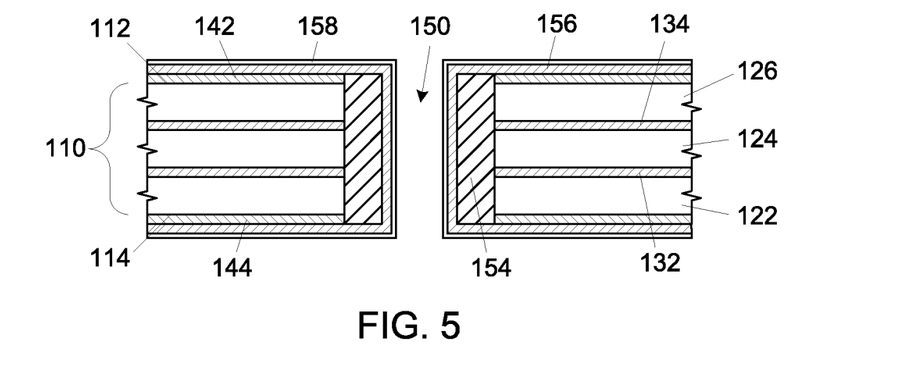
Figure 6:
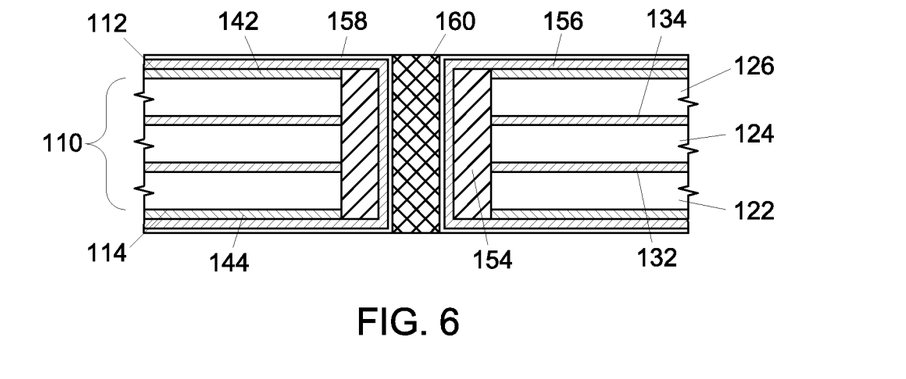

As shown in FIG. 5, a plating seed layer 158 may be formed over the barrier ferrilayer 156. In one embodiment, the plating seed layer 158 may comprise copper. As shown in FIG. 6, the opening 150 (see FIG. 5) may be filled with a conductive fill material 160. In an embodiment of the present description, the conductive fill material 160 may comprise conductive particles dispersed in a resin. In one embodiment of the present description, the conductive particles may comprise ferrite. In another embodiment of the present description, the resin may comprise epoxy. It is noted that the conductive fill material 160 fills the remaining opening 150 after the deposition of the magnetic material layer 154, the barrier layer 156, and the plating seed layer 158.

Figure 7:
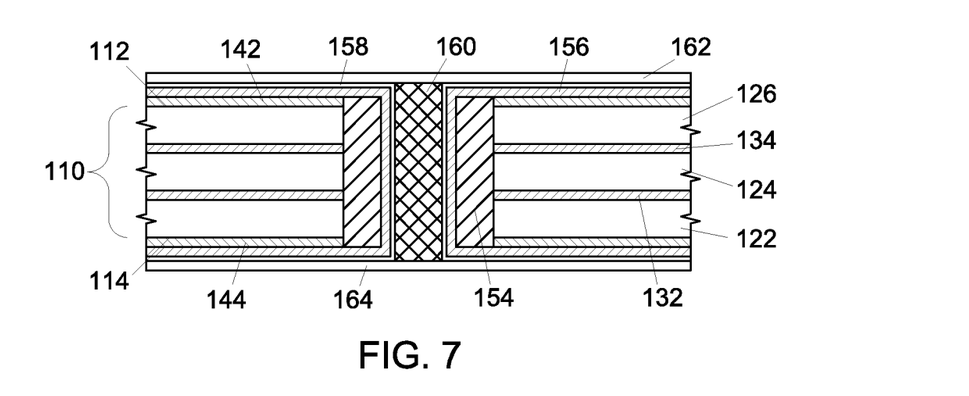

As shown in FIG. 7, a first metal layer 162 may be formed on the plating seed layer 158 proximate the first surface 112 of the base substrate 110 and a second metal layer 164 may be formed on the plating seed layer 158 proximate the first surface 112 of the base substrate 110. Although the first metal layer 162 and the second metal layer 164 is illustrated as separate layers from the plating seed layer 158, it is understood that portions of the plating seed layer 158 contacting the first metal layer 162 and the second metal layer 164 may be subsumed therein. The first metal layer 162 and the second metal layer 164 may be made of any appropriate metal, such as copper, silver, nickel, gold, and aluminum, alloys thereof, and the like. The first metal layer 162 and the second metal layer 164 may be formed by any appropriate method, including, but not limited to, plating. In one embodiment of the present description, the conductive material may be electroless plated copper.

Figure 8:
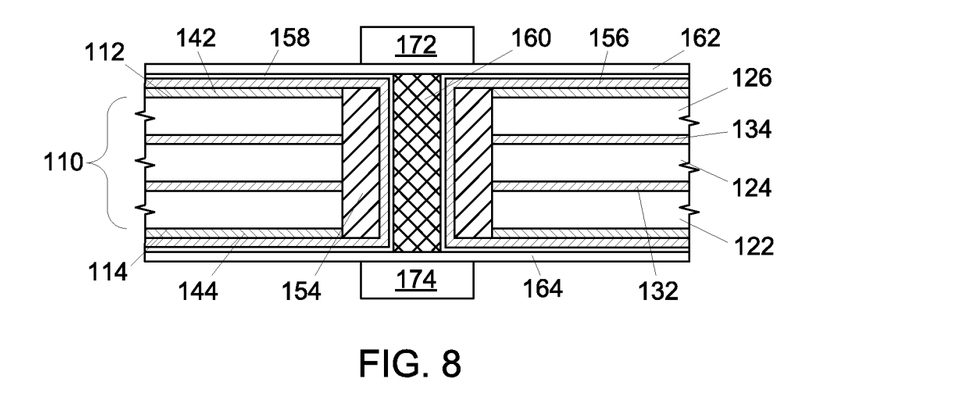

As shown in FIG. 8, a first mask 172 may be patterned on the first metal layer 162 proximate the conductive fill material 160 and an opposing second mask 174 may be patterned on the second metal layer 164 proximate the conductive fill material 160. In one embodiment of the present description, the first mask 172 and the second mask 174 may comprise any appropriate photoresist material and may be patterned by any known lithographic process.

Figure 9:
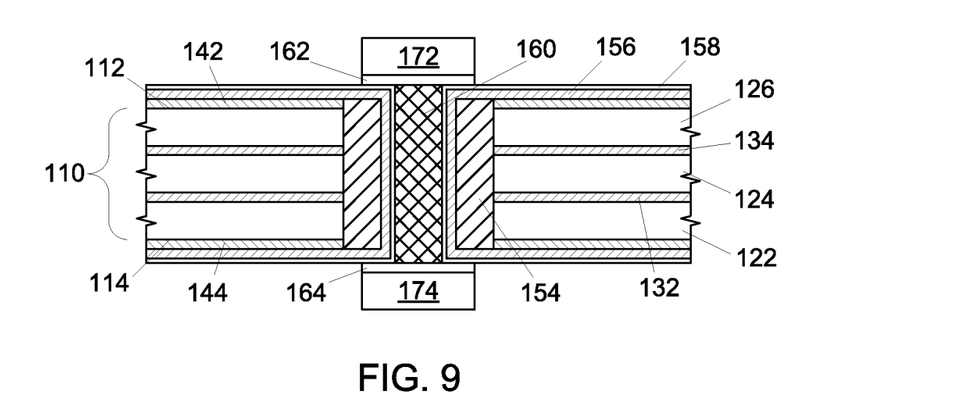
Figure 10:
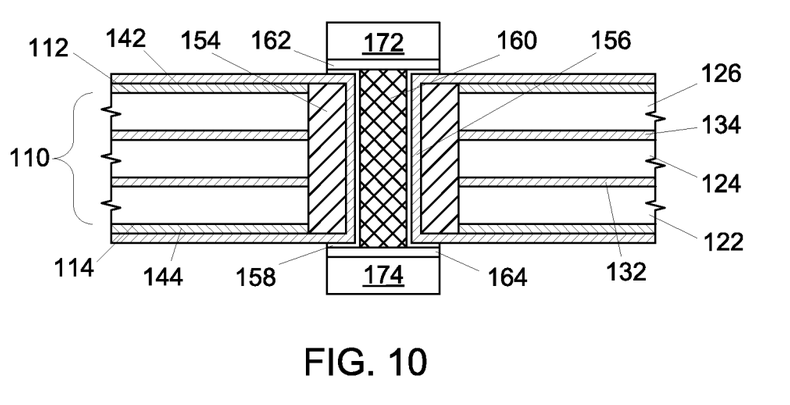

As shown in FIG. 9, a portion of the first metal layer 162 not protected by the first mask 172 and a portion of the second metal layer 164 not protected by the second mask 174 may be removed. In one embodiment of the present description, the first metal layer 162 and the second metal layer 164 may be simultaneously removed with an etching process, as known in the art. As shown in FIG. 10, portions of the plating seed layer 158 not protected by the first mask 172 and the second mask 174 may be removed. In one embodiment of the present description, the plating seed layer 158 may be removed with an etching process, as known in the art. It is understood that, if similar materials are used to form first metal layer 162, the second metal layer, and the plating seed layer 158, or if the plating seed layer 158 is subsumed into the first metal layer 162 and the second metal layer 164, a single etch step may be used to remove portions of the first metal layer 162, the second metal layer 164, and the plating seed layer 158 not protected by the first mask 172 and the second mask 174.

Figure 11:
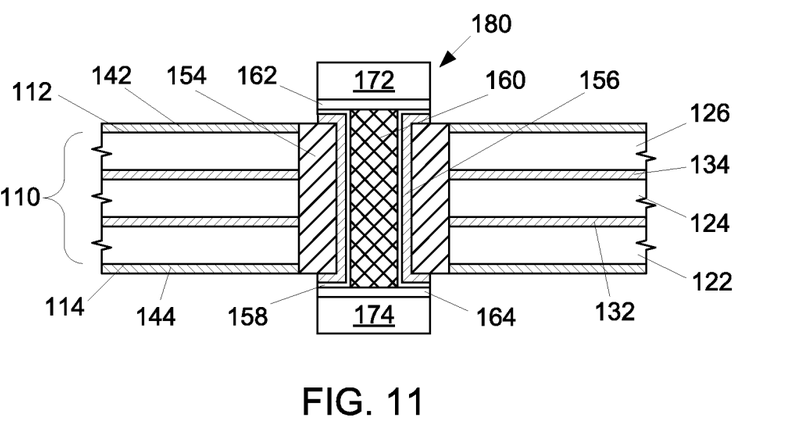

As shown in FIG. 11, a portion of the barrier layer 156 not protected by the first mask 172 and the second mask 174 may be removed to form an inductor 180. In one embodiment of the present description, when the barrier layer 156 comprises titanium, the portion of the barrier layer 156 not protected by the first mask 172 and the second mask 174 may be removed by a wet etch, such as with a hydrofluoric acid solution. In another embodiment of the present description, when the barrier layer 156 comprises a polymeric material layer or a nitride material layer, the portion of the barrier layer 156 not protected by the first mask 172 and the second mask 174 may be removed with a dry plasma etch, as known in the art.

Figure 12:
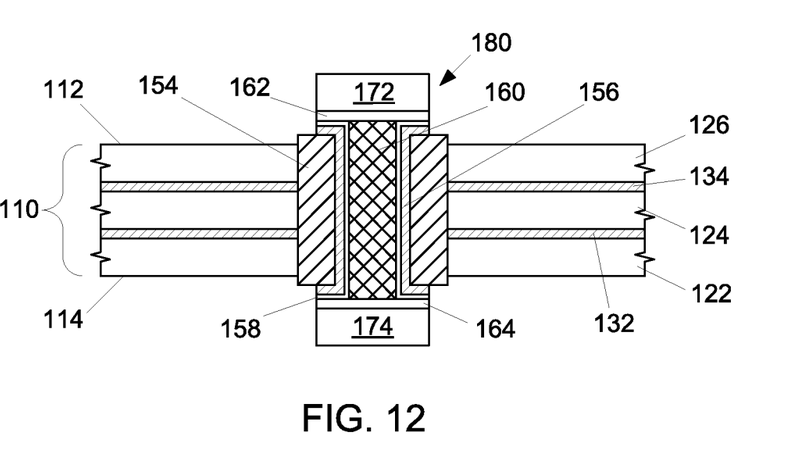
Figure 13:
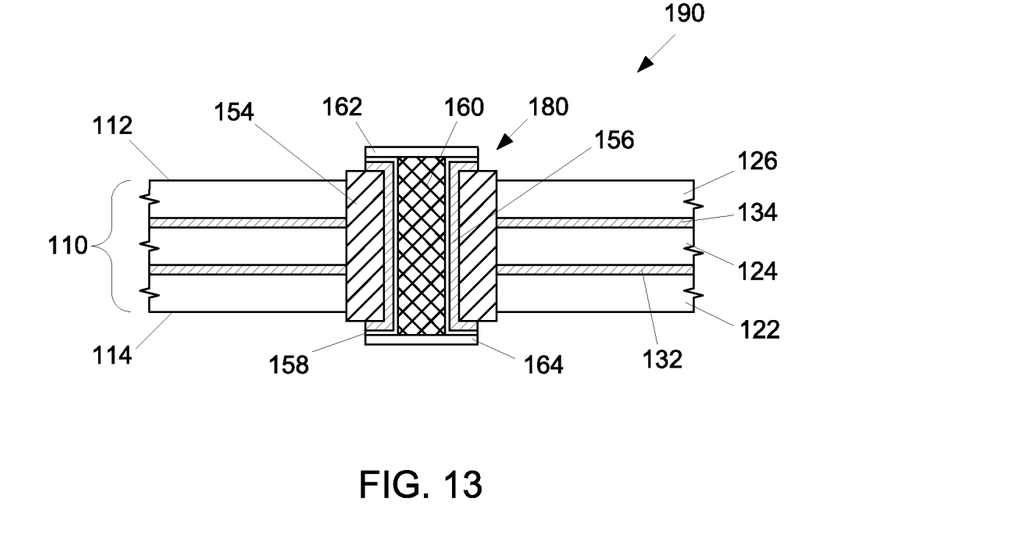

As shown in FIG. 12, the first protective film 142 and the second protective film 144 may be removed by any known processes. As shown in FIG. 13, the first mask 172 and the second mask 174 may then be removed, such as by etching or ashing, to form the electronic substrate 190.

Figure 14:
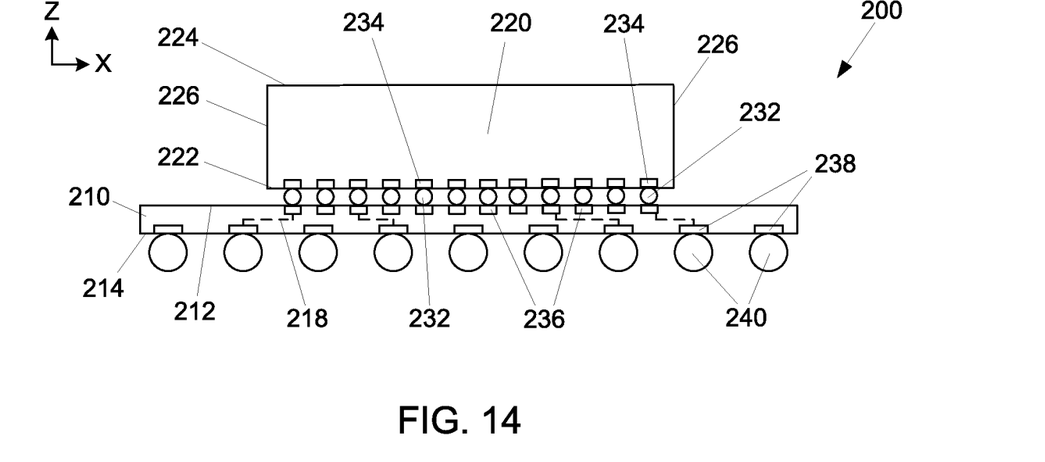
FIG. 14 is a side cross-sectional view of an integrated circuit package having an electronic substrate that contains at least one inductor, according to an embodiment of the present description.

FIG. 14 illustrates an integrated circuit assembly 200 having at least one integrated circuit device 220 electrically attached to an electronic substrate 210 in a configuration generally known as a flip-chip or controlled collapse chip connection ("C4") configuration, according to an embodiment of the present description.

The electronic substrate 210 may be any appropriate structure, including, but not limited to, an interposer. The electronic substrate 210 may have a first surface 212 and an opposing second surface 214. The electronic substrate 210 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 210 may further include conductive routes 218 or "metallization" (shown in dashed lines) extending through the electronic substrate 210. As will be understood to those skilled in the art, the conductive routes 218 may be a combination of conductive traces (not shown) and conductive vias (not shown) extending through the plurality of dielectric material layers (not shown). The electronic substrate 210 may include at least one inductor 180 of the present description, as discussed with regard to FIGS. 1-13.

The integrated circuit device 220 may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 44, the integrated circuit device 220 may have a first surface 222, an opposing second surface 224, and at least one side 226 extending between the first surface 222 and the second surface 224. The integrated circuit device 220 may be a monolithic silicon die or plurality of molded composited dice.

In an embodiment of the present description, the first integrated circuit device 220 may be electrically attached to the electronic substrate 210 with a plurality of device-to-substrate interconnects 232. In one embodiment of the present description, the device-to-substrate interconnects 232 may extend between bond pads 236 on the first surface 212 of the electronic substrate 210 and bond pads 234 on the first surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment, the device-to-substrate interconnects 232 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 232 may be copper bumps or pillars. In a further embodiment, the device-to-substrate interconnects 232 may be metal bumps or pillars coated with a solder material.

The bond pads 234 may be in electrical communication with integrated circuitry (not shown) within the integrated circuit device 220. The bond pads 236 on the first surface 212 of the electronic substrate 210 may be in electrical contact with the conductive routes 218. The conductive routes 218 may extend through the electronic substrate 210 and be connected to bond pads 238 on the second surface 214 of the electronic substrate 210. As will be understood to those skilled in the art, the electronic substrate 210 may reroute a fine pitch (center-to-center distance between the bond pads) of the integrated circuit device bond pads 236 to a relatively wider pitch of the bond pads 238 on the second surface 214 of the electronic substrate 210. In one embodiment of the present description, external interconnects 240 may be disposed on the bond pads 238 on the second surface 214 of the electronic substrate 210. The external interconnects 240 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The external interconnects 240 may be used to attach the integrated circuit assembly 200 to an external substrate (not shown), such as a motherboard.

Figure 15:
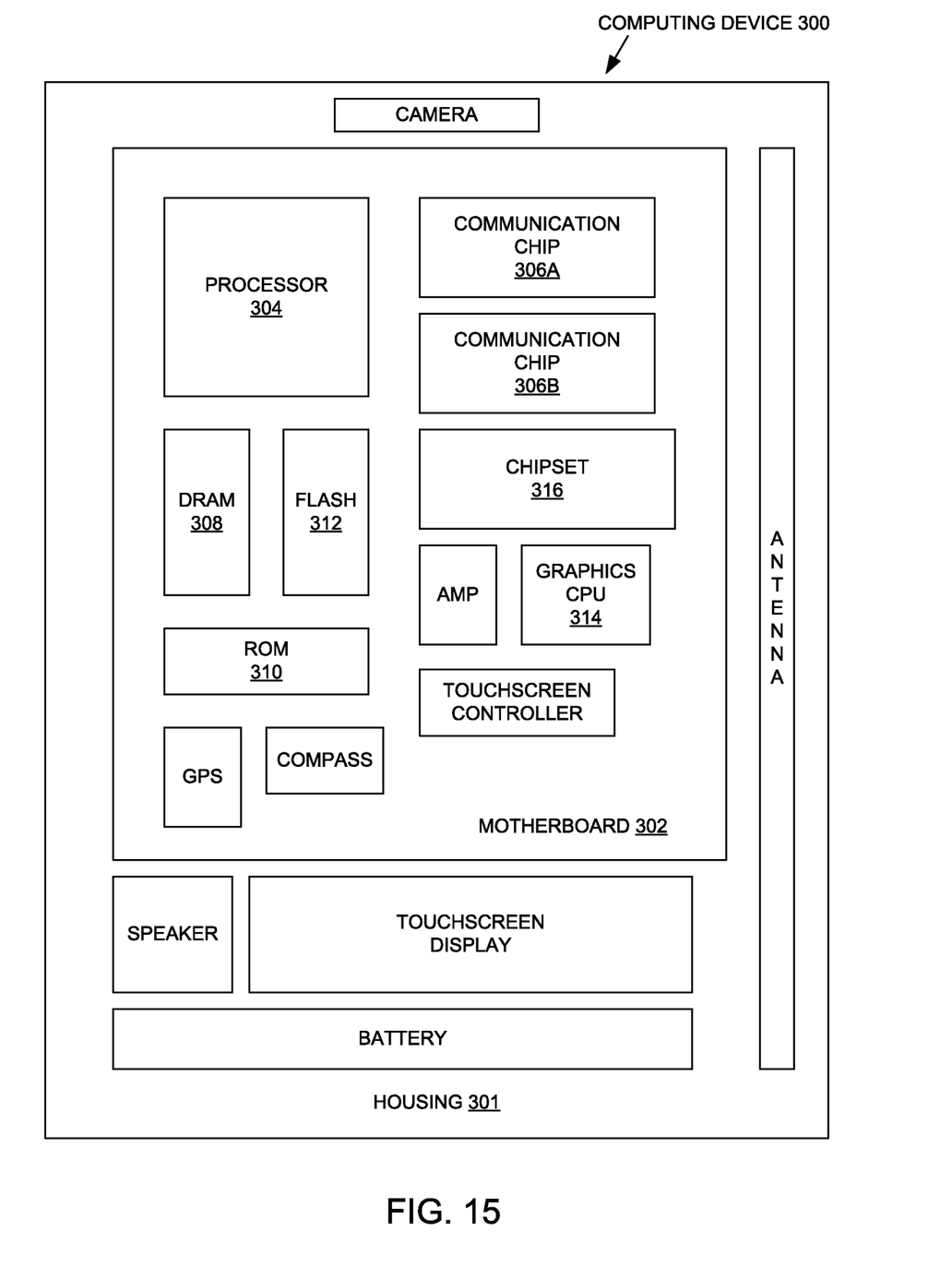
FIG. 15 is an electronic system, according to one embodiment of the present description.

FIG. 15 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate, which comprises a base substrate having a first surface and an opposing second surface, wherein the base substrate includes at least one opening defined by at least one sidewall extending from the first surface to the second surface; and an inductor disposed within the at least one opening, wherein the inductor comprises a magnetic material layer formed on the at least one sidewall of the at least one opening of the base substrate, a barrier layer on the magnetic material layer, a plating seed layer on the barrier layer, and a conductive fill material abutting the plating seed layer.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-15. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an electronic assembly comprising a base substrate having a first surface and an opposing second surface, wherein the base substrate includes at least one opening defined by at least one sidewall extending from the first surface to the second surface, and an inductor disposed within the at least one opening, wherein the inductor comprises a magnetic material layer on the at least one sidewall of the at least one opening of the base substrate, a barrier layer on the magnetic material layer, wherein the barrier layer comprises titanium, a plating seed layer on the barrier layer, and a conductive fill material abutting the plating seed layer.

In Example 2, the subject matter of Example 1 can optionally include the magnetic material layer comprising at least one material selected from the group consisting of iron, nickel, cobalt, and rare-earth metals.

In Example 3, the subject matter of any of Examples 1 to 2 can optionally include the plating seed layer comprising copper.

In Example 4, the subject matter of any of Examples 1 to 3 can optionally include the conductive fill material comprising conductive particles dispersed in a resin.

In Example 5, the subject matter of Example 4 can optionally include the conductive particles comprising ferrite.

Example 6 is an integrated circuit package comprising at least one integrated circuit device; and an electronic substrate to which the at least one integrated circuit device is electrically attached, wherein the electronic substrate comprises a base substrate having a first surface and an opposing second surface, wherein the base substrate includes at least one opening defined by at least one sidewall extending from the first surface to the second surface, and an inductor disposed within the at least one opening, wherein the inductor comprises a magnetic material layer on the at least one sidewall of the at least one opening of the base substrate, a barrier layer on the magnetic material layer, wherein the barrier layer comprises titanium, a plating seed layer on the barrier layer, and a conductive fill material abutting the plating seed layer.

In Example 7, the subject matter of Example 6 can optionally include the magnetic material layer comprising at least one material selected from the group consisting of iron, nickel, cobalt, and rare-earth metals.

In Example 8, the subject matter of any of Examples 6 to 7 can optionally include the plating seed layer comprising copper.

In Example 9, the subject matter of any of Examples 6 to 8 can optionally include the conductive fill material comprising conductive particles dispersed in a resin.

In Example 10, the subject matter of Example 9 can optionally include the conductive particles comprising ferrite.

Example 11 is an electronic system, comprising an electronic board and an integrated circuit package electrically attached to the electronic board, wherein the integrated circuit package comprises at least one integrated circuit device; and an electronic substrate to which the at least one integrated circuit device is electrically attached, wherein the electronic substrate comprises a base substrate having a first surface and an opposing second surface, wherein the base substrate includes at least one opening defined by at least one sidewall extending from the first surface to the second surface, and an inductor disposed within the at least one opening, wherein the inductor comprises a magnetic material layer on the at least one sidewall of the at least one opening of the base substrate, a barrier layer on the magnetic material layer, wherein the barrier layer comprises titanium, a plating seed layer on the barrier layer, and a conductive fill material abutting the plating seed layer.

In Example 12, the subject matter of Example 11 can optionally include the magnetic material layer comprising at least one material selected from the group consisting of iron, nickel, cobalt, and rare-earth metals.

In Example 13, the subject matter of any of Examples 11 to 12 can optionally include the plating seed layer comprising copper.

In Example 14, the subject matter of any of Examples 11 to 13 can optionally include the conductive fill material comprising conductive particles dispersed in a resin.

In Example 15, the subject matter of Example 14 can optionally include the conductive particles comprising ferrite.

Example 16 is a method of fabricating an electronic substrate comprising forming a base substrate having a first surface and an opposing second surface, forming at least one opening defined by at least one sidewall extending from the first surface to the second surface, and forming an inductor within the at least one opening, comprising forming a magnetic material layer on the at least one sidewall of the at least one opening of the base substrate, forming a barrier layer on the magnetic material layer, wherein the barrier layer comprises titanium, forming a plating seed layer on the barrier layer, and forming a conductive fill material abutting the plating seed layer.

In Example 17, the subject matter of Example 16 can optionally include forming the barrier layer by sputtering titanium.

In Example 18, the subject matter of Example 16 can optionally include forming the barrier layer comprising by physical vapor deposition.

In Example 19, the subject matter of any of Examples 16 to 18 can optionally include forming the magnetic material layer comprising forming a conformal magnetic material layer over the base substrate and in the at least one opening, and removing any portions of the conformal magnetic material layer not within the at least one opening.

In Example 20, the subject matter of any of Examples 16 to 19 can optionally include forming the magnetic material layer from at least one material selected from the group consisting of iron, nickel, cobalt, and rare-earth metals.

In Example 21, the subject matter of any of Examples 16 to 20 can optionally include forming the plating seed layer from copper.

In Example 22, the subject matter of any of Examples 16 to 21 can optionally include forming the conductive fill material from conductive particles dispersed in a resin.

In Example 23, the subject matter of Example 22 can optionally include the conductive particles comprising ferrite.

Example 24 is an electronic assembly comprising a base substrate having a first surface and an opposing second surface, wherein the base substrate includes at least one opening defined by at least one sidewall extending from the first surface to the second surface, and an inductor disposed within the at least one opening, wherein the inductor comprises a magnetic material layer on the at least one sidewall of the at least one opening of the base substrate, a barrier layer on the magnetic material layer, wherein the barrier layer comprises a polymeric material, a plating seed layer on the barrier layer, and a conductive fill material abutting the plating seed layer.

In Example 25, the subject matter of Example 24 can optionally include the polymeric material including at least one functional group.

In Example 26, the subject matter of any of Examples 24 to 25 can optionally include the polymeric material comprising (3-aminopropyl)-trimethoxysilane.

In Example 27, the subject matter of any of Examples 24 to 26 can optionally include the magnetic material layer comprising at least one material selected from the group consisting of iron, nickel, cobalt, and rare-earth metals.

In Example 28, the subject matter of any of Examples 24 to 27 can optionally include the plating seed layer comprising copper.

In Example 29, the subject matter of any of Examples 24 to 28 can optionally include the conductive fill material comprising conductive particles dispersed in a resin.

In Example 30, the subject matter of Example 29 can optionally include the conductive particles comprising ferrite.

Example 31 is an integrated circuit package comprising at least one integrated circuit device; and an electronic substrate to which the at least one integrated circuit device is electrically attached, wherein the electronic substrate comprises a base substrate having a first surface and an opposing second surface, wherein the base substrate includes at least one opening defined by at least one sidewall extending from the first surface to the second surface, and an inductor disposed within the at least one opening, wherein the inductor comprises a magnetic material layer on the at least one sidewall of the at least one opening of the base substrate, a barrier layer on the magnetic material layer, wherein the barrier layer comprises a polymeric material, a plating seed layer on the barrier layer, and a conductive fill material abutting the plating seed layer.

In Example 32, the subject matter of Example 31 can optionally include the polymeric material including at least one functional group.

In Example 33, the subject matter of Example 31 can optionally include the polymeric material comprising (3-aminopropyl)-trimethoxysilane.

In Example 34, the subject matter of any of Examples 31 to 33 can optionally include the magnetic material layer comprising at least one material selected from the group consisting of iron, nickel, cobalt, and rare-earth metals.

In Example 35, the subject matter of any of Examples 31 to 34 can optionally include the plating seed layer comprising copper.

In Example 36, the subject matter of any of Examples 31 to 35 can optionally include the conductive fill material comprising conductive particles dispersed in a resin.

In Example 37, the subject matter of Example 36 can optionally include the conductive particles comprising ferrite.

Example 38 is an electronic system, comprising an electronic board and an integrated circuit package electrically attached to the electronic board, wherein the integrated circuit package comprises at least one integrated circuit device; and an electronic substrate to which the at least one integrated circuit device is electrically attached, wherein the electronic substrate comprises a base substrate having a first surface and an opposing second surface, wherein the base substrate includes at least one opening defined by at least one sidewall extending from the first surface to the second surface, and an inductor disposed within the at least one opening, wherein the inductor comprises a magnetic material layer on the at least one sidewall of the at least one opening of the base substrate, a barrier layer on the magnetic material layer, wherein the barrier layer comprises a polymeric material, a plating seed layer on the barrier layer, and a conductive fill material abutting the plating seed layer.

In Example 39, the subject matter of Example 38 can optionally include the polymeric material including at least one functional group.

In Example 40, the subject matter of Example 38 can optionally include the polymeric material comprising (3-aminopropyl)-trimethoxysilane.

In Example 41, the subject matter of any of Examples 38 to 40 can optionally include the magnetic material layer comprising at least one material selected from the group consisting of iron, nickel, cobalt, and rare-earth metals.

In Example 42, the subject matter of any of Examples 38 to 41 can optionally include the plating seed layer comprising copper.

In Example 43, the subject matter of any of Examples 38 to 41 can optionally include the conductive fill material comprising conductive particles dispersed in a resin.

In Example 44, the subject matter of Example 43 can optionally include the conductive particles comprising ferrite.

Example 45 is a method of fabricating an electronic substrate comprising forming a base substrate having a first surface and an opposing second surface, forming at least one opening defined by at least one sidewall extending from the first surface to the second surface, and forming an inductor within the at least one opening, comprising forming a magnetic material layer on the at least one sidewall of the at least one opening of the base substrate, forming a barrier layer on the magnetic material layer, wherein the barrier layer comprises a polymeric material, forming a plating seed layer on the barrier layer, and forming a conductive fill material abutting the plating seed layer.

In Example 46, the subject matter of Example 45 can optionally include forming the barrier layer comprising forming a layer of the polymeric material including at least one functional group.

In Example 47, the subject matter of Example 45 can optionally include forming the barrier layer comprising (3-aminopropyl)-trimethoxysilane.

In Example 48, the subject matter of any of Examples 45 to 47 can optionally include forming the barrier layer by immersion.

In Example 49, the subject matter of any of Example 45 to 47 can optionally include forming the barrier layer comprising by spray coating.

In Example 50, the subject matter of any of Examples 45 to 49 can optionally include forming the magnetic material layer comprising forming a conformal magnetic material layer over the base substrate and in the at least one opening, and removing any portions of the conformal magnetic material layer not within the at least one opening.

In Example 51, the subject matter of any of Examples 45 to 50 can optionally include forming the magnetic material layer from at least one material selected from the group consisting of iron, nickel, cobalt, and rare-earth metals.

In Example 52, the subject matter of any of Examples 45 to 51 can optionally include forming the plating seed layer from copper.

In Example 53, the subject matter of any of Examples 45 to 52 can optionally include forming the conductive fill material from conductive particles dispersed in a resin.

In Example 54, the subject matter of Example 53 can optionally include the conductive particles comprising ferrite.

Example 55 is an electronic assembly comprising a base substrate having a first surface and an opposing second surface, wherein the base substrate includes at least one opening defined by at least one sidewall extending from the first surface to the second surface, and an inductor disposed within the at least one opening, wherein the inductor comprises a magnetic material layer on the at least one sidewall of the at least one opening of the base substrate, a barrier layer on the magnetic material layer, wherein the barrier layer comprises a nitride material layer, a plating seed layer on the barrier layer, and a conductive fill material abutting the plating seed layer.

In Example 56, the subject matter of Example 55 can optionally include the nitride material layer comprising silicon and nitrogen.

In Example 57, the subject matter of any of Examples 55 to 56 can optionally include the magnetic material layer comprising at least one material selected from the group consisting of iron, nickel, cobalt, and rare-earth metals.

In Example 58, the subject matter of any of Examples 55 to 57 can optionally include the plating seed layer comprising copper.

In Example 59, the subject matter of any of Examples 55 to 58 can optionally include the conductive fill material comprising conductive particles dispersed in a resin.

In Example 60, the subject matter of Example 59 can optionally include the conductive particles comprising ferrite.

Example 61 is an integrated circuit package comprising at least one integrated circuit device; and an electronic substrate to which the at least one integrated circuit device is electrically attached, wherein the electronic substrate comprises a base substrate having a first surface and an opposing second surface, wherein the base substrate includes at least one opening defined by at least one sidewall extending from the first surface to the second surface, and an inductor disposed within the at least one opening, wherein the inductor comprises a magnetic material layer on the at least one sidewall of the at least one opening of the base substrate, a barrier layer on the magnetic material layer, wherein the barrier layer comprises a nitride material layer, a plating seed layer on the barrier layer, and a conductive fill material abutting the plating seed layer.

In Example 62, the subject matter of Example 61 can optionally include the nitride material layer comprising silicon and nitrogen.

In Example 63, the subject matter of any of Examples 61 to 62 can optionally include the magnetic material layer comprising at least one material selected from the group consisting of iron, nickel, cobalt, and rare-earth metals.

In Example 64, the subject matter of any of Examples 61 to 63 can optionally include the plating seed layer comprising copper.

In Example 65, the subject matter of any of Examples 61 to 64 can optionally include the conductive fill material comprising conductive particles dispersed in a resin.

In Example 66, the subject matter of Example 65 can optionally include the conductive particles comprising ferrite.

Example 67 is an electronic system, comprising an electronic board and an integrated circuit package electrically attached to the electronic board, wherein the integrated circuit package comprises at least one integrated circuit device; and an electronic substrate to which the at least one integrated circuit device is electrically attached, wherein the electronic substrate comprises a base substrate having a first surface and an opposing second surface, wherein the base substrate includes at least one opening defined by at least one sidewall extending from the first surface to the second surface, and an inductor disposed within the at least one opening, wherein the inductor comprises a magnetic material layer on the at least one sidewall of the at least one opening of the base substrate, a barrier layer on the magnetic material layer, wherein the barrier layer comprises a nitride material layer, a plating seed layer on the barrier layer, and a conductive fill material abutting the plating seed layer.

In Example 68, the subject matter of Example 67 can optionally include the nitride material layer comprising silicon and nitrogen.

In Example 69, the subject matter of any of Examples 67 to 68 can optionally include the magnetic material layer comprising at least one material selected from the group consisting of iron, nickel, cobalt, and rare-earth metals.

In Example 70, the subject matter of any of Examples 67 to 69 can optionally include the plating seed layer comprising copper.

In Example 71, the subject matter of any of Examples 67 to 70 can optionally include the conductive fill material comprising conductive particles dispersed in a resin.

In Example 72, the subject matter of Example 71 can optionally include the conductive particles comprising ferrite.

Example 73 is a method of fabricating an electronic substrate comprising forming a base substrate having a first surface and an opposing second surface, forming at least one opening defined by at least one sidewall extending from the first surface to the second surface, and forming an inductor within the at least one opening, comprising forming a magnetic material layer on the at least one sidewall of the at least one opening of the base substrate, forming a barrier layer on the magnetic material layer, wherein the barrier layer comprises a nitride material layer, forming a plating seed layer on the barrier layer, and forming a conductive fill material abutting the plating seed layer.

In Example 74, the subject matter of Example 73 can optionally include forming the barrier layer comprising forming a layer of the nitride material comprising silicon and nitrogen.

In Example 75, the subject matter of any of Examples 73 to 74 can optionally include forming the barrier layer by chemical vapor deposition.

In Example 76, the subject matter of any of Examples 73 to 74 can optionally include forming the barrier layer by physical vapor deposition.

In Example 77, the subject matter of any of Examples 73 to 76 can optionally include forming the magnetic material layer comprising forming a conformal magnetic material layer over the base substrate and in the at least one opening, and removing any portions of the conformal magnetic material layer not within the at least one opening.

In Example 78, the subject matter of any of Examples 73 to 77 can optionally include forming the magnetic material layer from at least one material selected from the group consisting of iron, nickel, cobalt, and rare-earth metals.

In Example 79, the subject matter of any of Examples 73 to 78 can optionally include forming the plating seed layer from copper.

In Example 80, the subject matter of any of Examples 73 to 79 can optionally include forming the conductive fill material from conductive particles dispersed in a resin.

In Example 81, the subject matter of Example 80 can optionally include the conductive particles comprising ferrite.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An electronic assembly, comprising:
    a base substrate having a first surface and an opposing second surface, wherein the base substrate comprises at least one opening defined by at least one sidewall extending from the first surface to the second surface; and
    an inductor within the at least one opening, wherein the inductor comprises:
        a magnetic material layer on the at least one sidewall of the at least one opening of the base substrate;
        a barrier layer on the magnetic material layer, wherein the barrier layer comprises titanium;
        a plating seed layer on the barrier layer; and
        a conductive fill material abutting the plating seed layer.

2. The electronic assembly of claim 1, wherein the magnetic material layer comprises at least one material selected from the group consisting of iron, nickel, cobalt, and rare-earth metals.

3. The electronic assembly of claim 1, wherein the plating seed layer comprises copper.

4. The electronic assembly of claim 1, wherein the conductive fill material comprises conductive particles dispersed in a resin.

5. The electronic assembly of claim 4, wherein the conductive particles comprise ferrite.

6. An integrated circuit package, comprising:
    at least one integrated circuit device; and
    an electronic substrate to which the at least one integrated circuit device is electrically attached,
        wherein the electronic substrate comprises:
            a base substrate having a first surface and an opposing second surface, wherein the base substrate comprises at least one opening defined by at least one sidewall extending from the first surface to the second surface; and
            an inductor within the at least one opening, wherein the inductor comprises:
                a magnetic material layer on the at least one sidewall of the at least one opening of the base substrate;
                a barrier layer on the magnetic material layer, wherein the barrier layer comprises titanium;
                a plating seed layer on the barrier layer; and
                a conductive fill material abutting the plating seed layer.

7. The integrated circuit package of claim 6, wherein the magnetic material layer comprises at least one material selected from the group consisting of iron, nickel, cobalt, and rare-earth metals.

8. The integrated circuit package of claim 6, wherein the plating seed layer comprises copper.

9. The integrated circuit package of claim 6, wherein the conductive fill material comprises conductive particles dispersed in a resin.

10. The integrated circuit package of claim 9, wherein the conductive particles comprise ferrite.

11. The integrated circuit package of claim 6, further comprising an electronic board, wherein the electronic substrate is electrically attached to the electronic board.

* * * * *